United States Patent
Chen

(10) Patent No.: US 7,990,774 B2
(45) Date of Patent: Aug. 2, 2011

(54) COMMUNICATION DEVICE AND METHOD FOR ERASING DATA FROM A COMMUNICATION DEVICE

(75) Inventor: Chi-Hsien Chen, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 59 days.

(21) Appl. No.: 12/633,878

(22) Filed: Dec. 9, 2009

(65) Prior Publication Data
US 2010/0271884 A1      Oct. 28, 2010

(30) Foreign Application Priority Data

Apr. 23, 2009   (CN) .......................... 2009 1 0301786

(51) Int. Cl.
*G11C 16/00*       (2006.01)
(52) U.S. Cl. .......... 365/185.29; 365/185.22; 365/185.33
(58) Field of Classification Search .............. 365/185.02
See application file for complete search history.

(56) References Cited

U.S. PATENT DOCUMENTS

| | | | | |
|---|---|---|---|---|
| 5,621,687 A | * | 4/1997 | Doller | 365/185.29 |
| 5,715,193 A | * | 2/1998 | Norman | 365/185.02 |
| 6,081,447 A | * | 6/2000 | Lofgren et al. | 365/185.02 |

\* cited by examiner

*Primary Examiner* — Tan T. Nguyen
(74) *Attorney, Agent, or Firm* — Raymond J. Chew

(57) ABSTRACT

A communication device and method for erasing data include setting erasing parameters and initializing the erasing parameters, erasing data in a target data block of the flash memory once, and calculate a current erasing count of the erased block, setting a first bit of the erased block as "0". The communication device and method further determines whether other bits except the first bit of the erased block are all "1", determines whether the current erasing count is less than the max erasing time if any bit except the first bit of the erased block is not "1", and prompts an output if the current erasing count equals to the max erasing time.

12 Claims, 3 Drawing Sheets

COMMUNICATION DEVICE AND METHOD FOR ERASING DATA FROM A COMMUNICATION DEVICE

BACKGROUND

1. Technical Field

Embodiments of the present disclosure relate to managing data, and more particularly to a communication device and a method for erasing data of the communication device.

2. Description of Related Art

Generally, a communication device use a flash memory as a storage medium. The flash memory includes many blocks for storing data. Under normal conditions, a target block of the communication device after data deletion is in a normal state, such as a writeable state and a readable state, for example. However, if the communication device is powered off abruptly, the target block of the communication device may be in an abnormal state, such as unwritable, or unreadable state, for example.

What is needed, therefore, is a communication device and a data erasing method to ensure the communication device in the normal state after data is erased from the communication device.

DETAILED DESCRIPTION

The invention is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

In general, the word "module," as used herein, refers to logic embodied in hardware or firmware, or to a collection of software instructions, written in a programming language, such as, for example, Java, C, or assembly. One or more software instructions in the modules may be embedded in firmware, such as an EPROM. It will be appreciated that modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1:
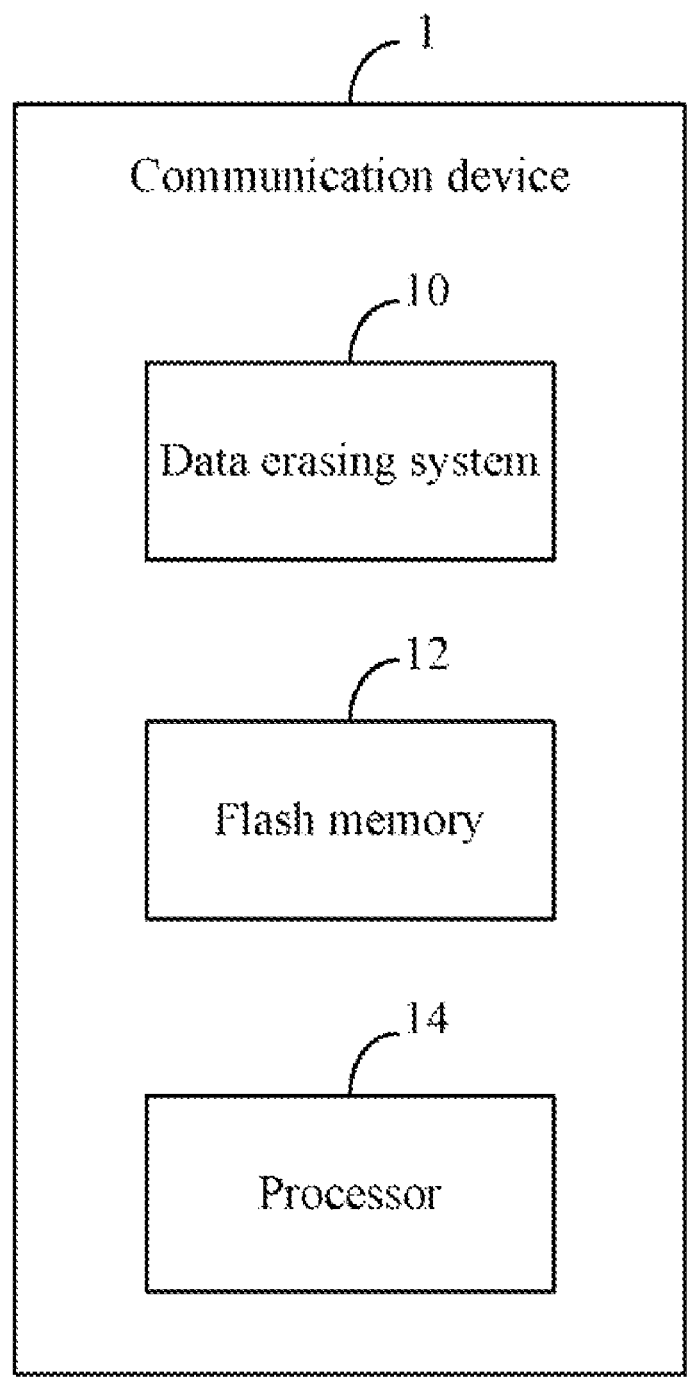
FIG. 1 is a block diagram of one embodiment of a communication device including a data erasing system.

FIG. 1 is a block diagram of one embodiment of a communication device 1 including a data erasing system 10. The data erasing system 10 may be used to erase data of the communication device 1, and ensure the communication device 1 is in a normal state after the data has been erased from the communication device 1.

The communication device 1 may be a mobile phone, a personal digital assistant (PDA), a handheld computer, or any other kind of computing device. In the embodiment as shown in FIG. 1, the communication device 1 may further include a flash memory 12, and a processor 14. The flash memory 12 stores one or more programs, such as programs of an operating system, other applications of the communication device 1, and various kinds of data, such as erasing parameters, for example. In one embodiment, the flash memory 12 may be a memory stick, a subscriber identification module (SIM) card, a smart media card, a compact flash card, or any other type of memory card. The processor 14 executes one or more computerized operations of the communication device 1 and other applications, to provide functions of the communication device 1.

Figure 2:
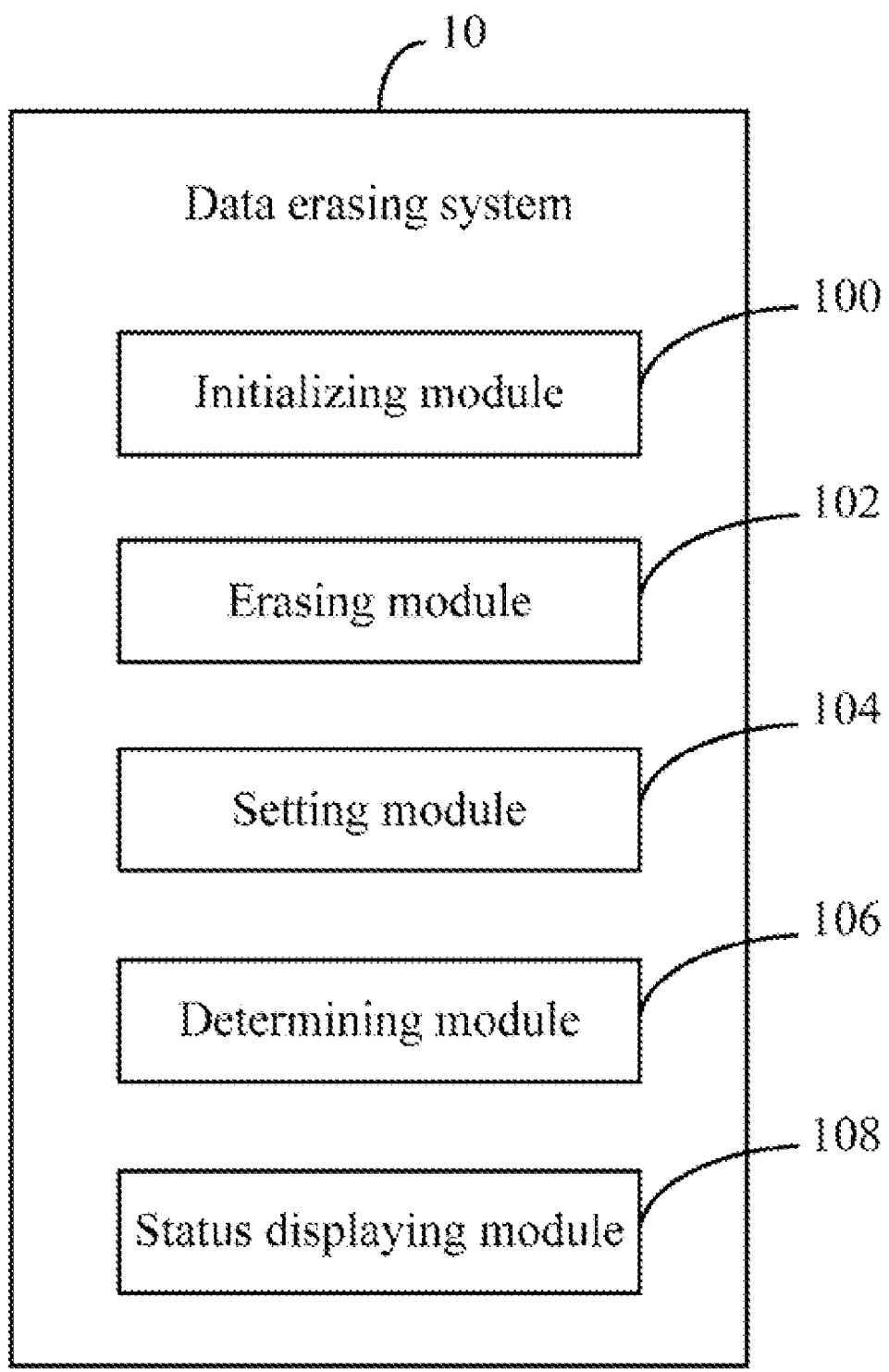
FIG. 2 is a block diagram of one embodiment of the data erasing system in FIG. 1.

FIG. 2 is a block diagram of one embodiment of the communication device 1 including the data erasing system 10. In one embodiment, the data erasing system 10 includes an initializing module 100, an erasing module 102, a setting module 104, a determining module 106, and a status displaying module 108. The modules 100, 102, 104, 106, and 108 may comprise one or more computerized codes to be executed by the processor 14 to perform one or more operations of the communication device 1.

The initializing module 100 sets erasing parameters. In one embodiment, the erasing parameters include a current erasing count and a max erasing time. The flash memory includes many data blocks in various block sizes, such as 128 bytes, 64 bytes, 32 bytes, 16 bytes, or 8 bytes, for example.

The initializing module 100 also initializes the current erasing count as "0", and initializes the max erasing time to a predetermined integer. In one embodiment, the predetermined number may be set as 3.

The erasing module 102 erases data in a target data block of the flash memory 12 once, and calculates the current erasing count of the erased block. In one embodiment, after the erasing module 102 erases data in the block of the flash memory 12 once, the current erasing count is incremented by 1.

The setting module 104 sets a first bit of the erased block as "0" to ensure that the erased block is in a writeable state.

The determining module 106 determines whether the other bits except for the first bit of the erased block are all "1". It should be understood that if the other bits except for the first bit of the erased block are all "1" indicates that the erased block is in a normal state.

The determining module 106 also determines whether to erase data in other blocks except for the erased block of the flash memory 12 if the other bits except for the first bit of the erased block are all "1". If data in other blocks of the flash memory 12 need to be erased, the erasing module 102 erases data in specified blocks.

The determining module 106 further determines whether the current erasing count is less than the max erasing time if any bits except for the first bit of the erased block is not "1".

The status displaying module 108 displays that the flash memory 12 is in an abnormal state if the current erasing count equals to the max erasing time.

Figure 3:
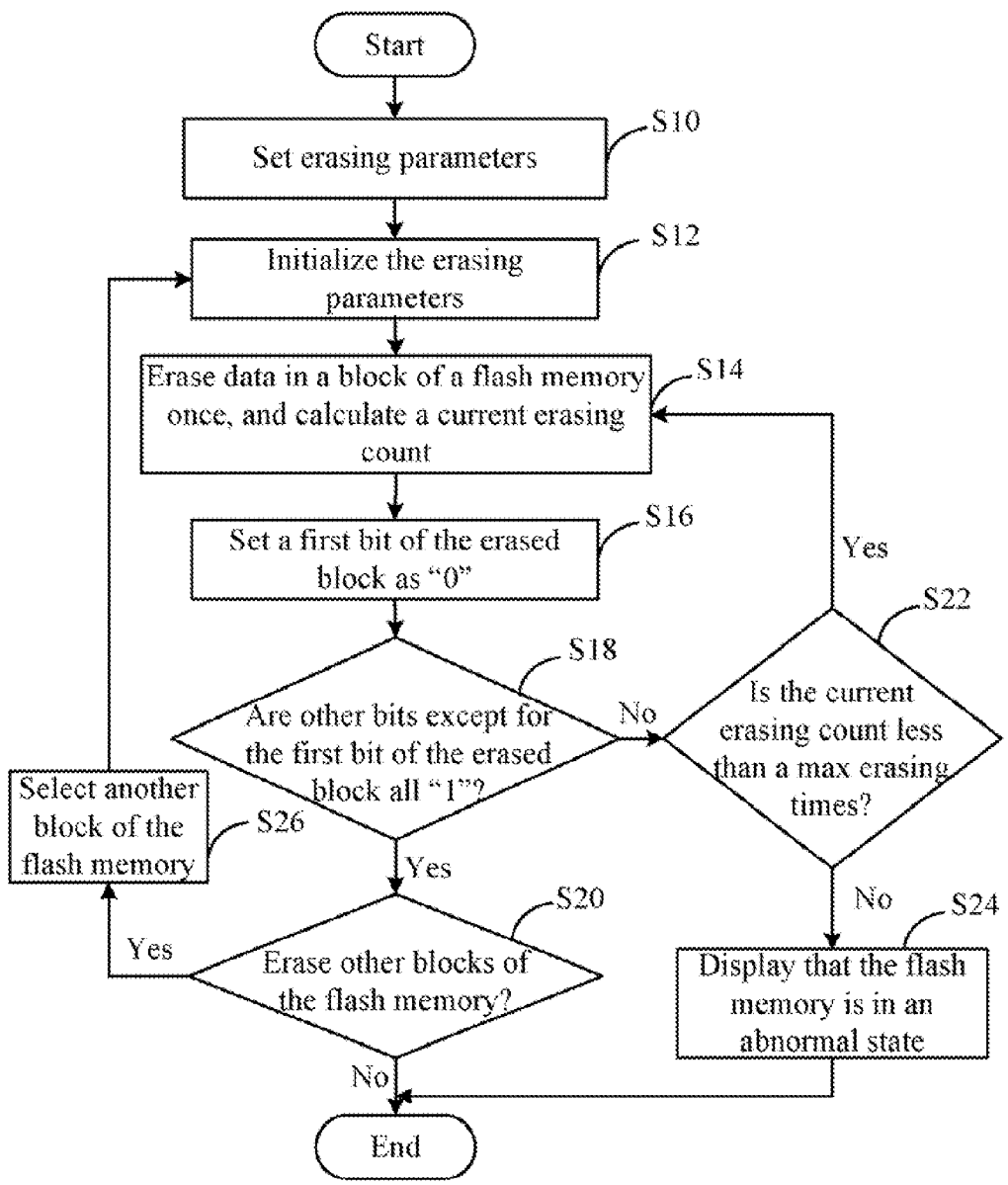
FIG. 3 is a flowchart of one embodiment of a method for erasing data from the communication device of FIG. 1.

FIG. 3 is a flowchart of one embodiment of a method for erasing data from a communication device 1. Depending on the embodiment, additional blocks may be added, others removed, and the ordering of the blocks may be replaced.

In block S10, the initializing module 100 sets erasing parameters. The erasing parameters include a current erasing count and a max erasing time.

In block S12, the initializing module 100 also initializes the current erasing count as "0", initializes the max erasing time as a predetermined integer, for example, initializes the max erasing time as 3.

In block S14, the erasing module 102 erases data in a target data block of the flash memory 12 once, and calculates the current erasing count of the erased block.

In block S16, the setting module 104 sets a first bit of the erased block as "0" to ensure that the erased block is in a writeable state.

In block S18, the determining module 106 determines whether other bits except for the first bit of the erased block are all "1". The other bits except for the first bit of the erased block all "1" indicates that the erased block is in a correct format state.

If the other bits except for the first bit of the erased block are all "1", in block S20, the determining module 106 determines whether to erase data in other blocks except for the erased block of the flash memory 12. If data in other blocks of the flash memory 12 need to be erased, in block S26, the erasing module 102 select another block of the flash memory 12 need to be erased.

Otherwise, if any bits except for the first bit of the erased block are not "1", in block S22, the determining module 106 determines whether the current erasing count is less than the max erasing time.

If the current erasing count is less than the max erasing time, the procedure returns to block S14 described above.

Otherwise, if the current erasing count is not less than the max erasing time, in block S24, the status displaying module 108 displays that the flash memory 12 is in an abnormal state if the current erasing count equals to the max erasing time.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A communication device, the communication device comprising:
    a flash memory;
    at least one processor; and
    one or more programs stored in the flash memory and being executable by the at least one processor, the one or more programs comprising:
    an initializing module operable to set erasing parameters, the erasing parameters comprise a current erasing count and a max erasing time, the initializing module further operable to initialize the current erasing count as zero, and initialize the max erasing time as a predetermined integer;
    an erasing module operable to erase data in a target data block of the flash memory once, and calculate the current erasing count of the erased block;
    a setting module operable to set a first bit of the erased block as "0";
    a determining module operable to determine whether other bits except for the first bit of the erased block are all "1", and determine whether the current erasing count is less than the max erasing time if any bits except for the first bit of the erased block is not "1";
    a status displaying module operable to display that the flash memory is in an abnormal state if the current erasing count equals to the max erasing time.

2. The communication device according to claim 1, wherein the setting module sets the first bit of the erased block to "0" to ensure that the erased block is in a writeable state.

3. The communication device according to claim 1, wherein the bits except for the first bit of the erased block being all "1" indicates that the erased block is in a normal state.

4. The communication device according to claim 1, wherein the erasing module is further operable to select a next block of the flash memory and returning to the step (b) if the other bits except for the first bit of the erased block are all "1" and if there are other blocks of the flash memory need to be erased.

5. A data erasing method for a communication device, the method comprising:
    (a) setting erasing parameters, the erasing parameters comprise a current erasing count and a max erasing time;
    (b) initializing the current erasing count as zero, and initializing the max erasing time as a predefined integer;
    (c) erasing data in a target data block of a flash memory once, and calculate a current erasing count of the erased block;
    (d) setting a first bit of the erased block as "0";
    (e) determining whether other bits except for the first bit of the erased block are all "1";
    (f) determining whether the current erasing count is less than the max erasing time if any bit except for the first bit of the erased block is not "1";
    (g) returning to the step (c) if the current erasing count is less than the max erasing time; and
    (h) displaying that the flash memory is in an abnormal state if the current erasing count equals to the max erasing time.

6. The method according to claim 5, wherein the first bit of the erased block being "0" indicates that the erased block is in a writeable state.

7. The method according to claim 5, wherein the bits except for the first bit of the erased block being all "1" indicates that the erased block is in a normal state.

8. The method according to claim 5, further comprising:
    selecting a next block of the flash memory and returning to the step (b) if the other bits except for the first bit of the erased block are all "1" and if there are other blocks of the flash memory need to be erased.

9. A computer readable medium having stored thereon instructions that, when executed by a processor, causing the processor to perform data erasing method for a communication device, the method comprising:
    (a) setting erasing parameters, the erasing parameters comprise a current erasing count and a max erasing time;
    (b) initializing the current erasing count as zero, and initializing the max erasing time as a predefined integer;
    (c) erasing data in a target data block of a flash memory once, and calculate a current erasing count of the erased block;
    (d) setting a first bit of the erased block as "0";
    (e) determining whether other bits except for the first bit of the erased block are all "1";
    (f) determining whether the current erasing count is less than the max erasing time if any bit except for the first bit of the erased block is not "1";
    (g) returning to the step (c) if the current erasing count is less than the max erasing time; and
    (h) displaying that the flash memory is in an abnormal state if the current erasing count equals to the max erasing time.

10. The medium according to claim 9, wherein the first bit of the erased block being "0" indicates that the erased block is in a writeable state.

11. The medium according to claim 9, wherein the bits except for the first bit of the erased block being all "1" indicates that the erased block is in a normal state.

12. The medium according to claim 9, further comprising:
    selecting a next block of the flash memory and returning to the step (b) if the other bits except for the first bit of the erased block are all "1" and if there are other blocks of the flash memory need to be erased.

* * * * *